United States Patent
Hsu et al.

(10) Patent No.: US 11,419,206 B2
(45) Date of Patent: Aug. 16, 2022

(54) CIRCUIT BOARD STRUCTURE FOR INCREASING ISOLATION

(71) Applicant: WISTRON NEWEB CORPORATION, Hsinchu (TW)

(72) Inventors: Yuan-Chia Hsu, Hsinchu (TW); Chin-Lung Yeh, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 0 days.

(21) Appl. No.: 17/468,768

(22) Filed: Sep. 8, 2021

(65) Prior Publication Data
US 2022/0159823 A1    May 19, 2022

(30) Foreign Application Priority Data
Nov. 16, 2020    (TW) .................................. 109139859

(51) Int. Cl.
*H05K 1/02*    (2006.01)

(52) U.S. Cl.
CPC ........... *H05K 1/025* (2013.01); *H05K 1/0245* (2013.01); *H05K 2201/09063* (2013.01); *H05K 2201/09336* (2013.01)

(58) Field of Classification Search
CPC ............................ H05K 1/025; H05K 1/0245
See application file for complete search history.

(56) References Cited

U.S. PATENT DOCUMENTS
2015/0319847 A1    11/2015    Kim et al.

FOREIGN PATENT DOCUMENTS

| CN | 1902990 A | 1/2007 |
|---|---|---|
| CN | 105050312 A | 11/2015 |
| WO | 2005065000 A1 | 7/2005 |

*Primary Examiner* — Jeremy C Norris
(74) *Attorney, Agent, or Firm* — McClure, Qualey & Rodack, LLP

(57) ABSTRACT

A circuit board structure for improving isolation is provided. The circuit board structure can increase the isolation by adding a section of floating metal between two signal transmission lines and adjusting the distance between the floating metal and the two signal transmission lines.

10 Claims, 9 Drawing Sheets

CIRCUIT BOARD STRUCTURE FOR INCREASING ISOLATION

CROSS-REFERENCE TO RELATED PATENT APPLICATION

This application claims the benefit of priority to Taiwan Patent Application No. 109139859, filed on Nov. 16, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disposure relates to a circuit board structure, and more particularly to a circuit board structure for improving isolation.

BACKGROUND OF THE DISCLOSURE

Many wireless frequency bands are covered by existing wireless communication products, such as GPS, LTE/5G, BLUETOOTH 2.4 GHz, ZigBee, UWB, WI-FI 2.4 GHz, 5 GHz, 6 G. When many frequency bands need to be covered by a single product, reducing interferences between different frequencies becomes an important issue. Products commonly reduce an influence of antennas on each other by arranging the antennas at different positions.

Differently, isolation between signal lines on a printed circuit board (PCB) can be ensured by increasing a distance of the signal lines. However, due to a limited area of the PCB due to cost considerations, a general way of increasing the isolation effect is to use ground lines to isolate and reduce mutual interference of the signal lines. However, the isolation formed by the ground lines may cause other noise to interfere with a main signal through the ground path, thereby causing issues associated with electromagnetic interference. In order to prevent this kind of issue, an additional filter is needed to filter the noise, which leads to an increase in design costs.

Therefore, improving the isolation of the PCB through structural design has become one of important issues in the related art.

SUMMARY OF THE DISCLOSURE

In response to the above-referenced technical inadequacies, the present disclosure provides a circuit board structure for improving isolation, and the isolation on the printed circuit board can be increased without additional components.

In one aspect, the present disclosure provides a circuit board structure for improving isolation, which includes a first signal line, a first ground line, a second signal line, a first floating metal, a second ground line, a third ground line, a fourth ground line, a first ground extending portion and a second ground extending portion. The first signal line is disposed along a first direction and across a first area, a floating area and a second area arranged in sequence. The first ground line is disposed at a first side of the first signal line. The second signal line is disposed at a second side of the first signal line, and the first side is opposite to the second side. The first floating metal is disposed between the first signal line and the second signal line, is parallel to the first signal line and the second signal line, and is floatingly disposed in the floating area. The second ground line is disposed at the second side, and the second signal line is located between the second ground line and the first signal line. The third ground line is disposed between the first signal line and the second signal line, and is disposed in the first area. The fourth ground line is disposed between the first signal line and the second signal line, and is disposed in the second area. The first signal line, the second signal line, the first floating metal, the first ground line, the second ground line, the third ground line, and the fourth ground line are located in a first metal layer. The first ground extending portion is located in the floating area and a second metal layer, is electrically connected to the first ground line, and is extended from a position corresponding to the first ground line, along a second direction that the first ground line towards the first signal line. The second metal layer is different from the first metal layer. The second ground extending portion is located in the floating area and the second metal layer, is electrically connected to the second ground line, and is extended from a position corresponding to the second ground line, along a third direction that the second ground line towards the second signal line. The first floating metal is floatingly disposed in the floating area, and is not electrical connected to the first ground line, the second ground line, the third ground line and the fourth ground line.

Therefore, the circuit board structure for improving isolation provided by the present disclosure can add a section of floating metal between two signal transmission lines, and appropriately adjust distances between the floating metal and the two signal transmission lines, so as to prevent ground current from flowing in a local area, reduce interferences caused by energy from ground, and improve the isolation on the printed circuit board without any additional components.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
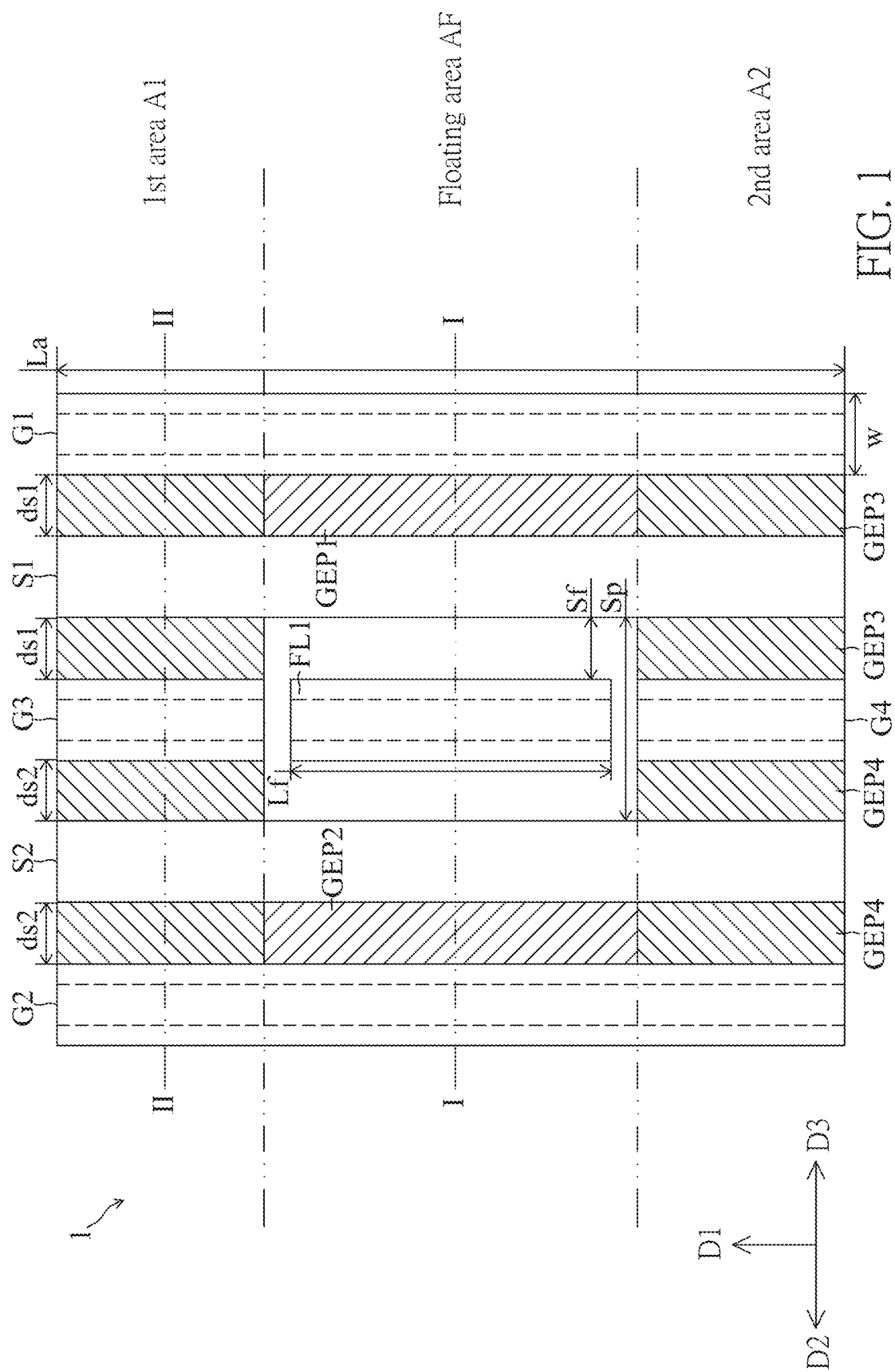
FIG. 1 is a top view of a circuit board structure for improving isolation according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Grounded coplanar waveguide (GCPW) circuits increases the number of ground paths around a circuit by placing ground layers on the bottom and the top of dielectric material, on the same plane as a signal transmission line, and on both sides of the signal transmission line. Therefore, the isolation between the two signal transmission lines can be increased. Based on the above structure, the present disclosure adds a section of floating metal between two signal transmission lines and appropriately adjusts spacings between the floating metal and the two signal transmission lines to provide a structure that increases the isolation of the printed circuit board (PCB).

Figure 2:
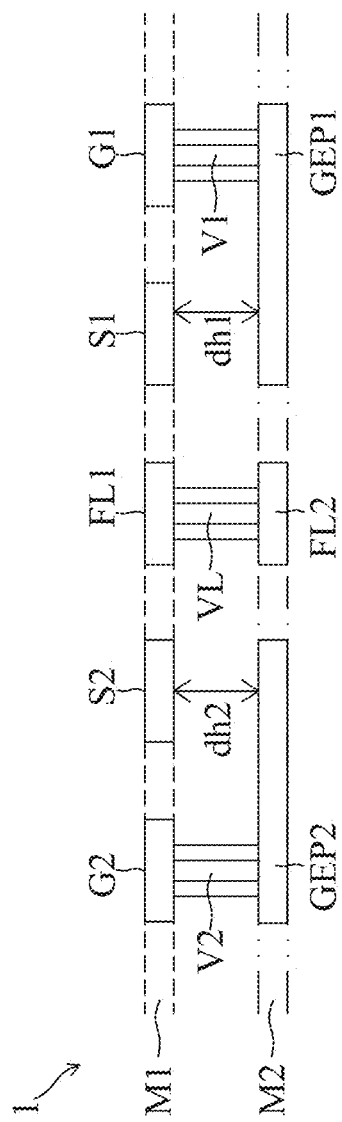
FIG. 2 is a cross-sectional view along a section line I-I in FIG. 1.
Figure 3:
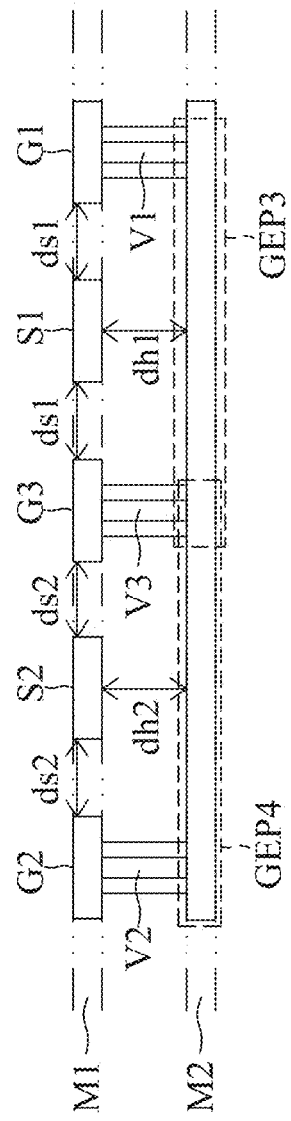
FIG. 3 is a cross-sectional view along a section line II-II in FIG. 1.

FIG. 1 is a top view of a circuit board structure for improving isolation according to a first embodiment of the present disclosure, FIG. 2 is a cross-sectional view along a section line I-I in FIG. 1, and FIG. 3 is a cross-sectional view along a section line II-II in FIG. 1. Reference is made to FIGS. 1 to 3, an embodiment of the present disclosure provides a circuit board structure 1 for improving isolation, the circuit board structure 1 includes a first signal line S1, a first ground line G1, a second signal line S2, a first floating connection Metal FL1, a second ground line G2, a third ground line G3, a fourth ground line G4, a first ground extending portion GEP1 and a second ground extending portion GEP2.

As shown in FIG. 1, the circuit board structure 1 can be divided into a first area A1, a floating area AF, and a second area A2 that are sequentially arranged along a first direction D1. The first signal line S1 is disposed along the first direction D1 and across the first area A1, the floating area AF, and the second area A2.

The first ground line G1 is arranged on one side of the first signal line S1, and the second signal line S2 is arranged on an opposite side of the first signal line S1. The second ground line G2 is also arranged on the opposite side of the first signal line S1, and the second signal line S2 is located between the second ground line G2 and the first signal line S1.

As shown in FIG. 2, a first floating metal FL1 is provided in the floating area AF and located between the first signal line S1 and the second signal line S2. The first floating metal FL1 is parallel to the first signal line S1 and the second signal line S2, and is floatingly disposed in the floating area AF.

As shown in FIG. 3, a third ground line G3 is provided in the first area A1, and is disposed between the first signal line S1 and the second signal line S2. Similarly, in the second area A2, the fourth ground line G4 is disposed between the first signal line S1 and the second signal line S2.

As shown in FIGS. 1 to 3, the first signal line S1, the second signal line S2, the first floating metal FL1, the first ground line G1, the second ground line G2, the third ground line G3, and the fourth ground line G4 is located in a first metal layer M1.

In FIG. 3, the first ground line G1 is electrically connected to the third ground line G3 in the first area A1 through the third ground extending portion GEP3 located in the second metal layer M2, and the first ground line G1 is electrically connected to the fourth ground line G4 through the third ground extending portion GEP3 in the second area A2. It should be noted that the second metal layer M2 is different from the first metal layer M1, and the second metal layer M2 can be disposed under the first metal layer M1 as shown in FIG. 3.

Similarly, the second ground line G2 is electrically connected to the third ground line G3 in the first area A1 through the fourth ground extending portion GEP4 located in the second metal layer M2, and is electrically connected to the fourth ground line G4 in the second area A2 through the fourth ground extending portion GEP4 located in the second metal layer M2. It should be noted that the first ground line G1 and the third ground wire G3 can be connected to the third ground extending portion GEP3 respectively through vias V1 and V3 located in a dielectric layer, the second ground line G2 and the third ground line G3 can be connected to the fourth ground extending GEP4 respectively through vias V2 and V3 located in the dielectric layer, respectively.

Examples of single-ended signals are shown in the embodiments of FIGS. 1 to 3, but the present disclosure is not limited thereto. Types of the first signal line S1 and the second signal line S2 can include single-ended signal lines and differential pair signal lines. This embodiment takes a GCPW transmission line structure as an example. As shown in FIG. 3, ground lines (that is, the first ground lines G1, the third ground lines G3, and the third ground extending portion GEP3) surround at left, right sides of the first signal line S1 and beneath the first signal line S1. Since spacings between the first signal line S1 and the ground lines are formed as equivalent capacitances, a matched impedance line, for example, 50 ohms, can be obtained by controlling an impedance of the first signal line S1, adjusting spacings ds1 respectively between the first signal lines S1 and the first and third ground lines G1 and G3, and a spacing dh1 between the first signal line S1 and the third ground extending portion GEP3 below, and calculating according to transmission line formula.

When there are two first signal lines S1 and second signal lines S2 that have been impedance matched to 50 ohms are adjacent, as shown in FIG. 3, the first signal line Si and the second signal line S2 are independent transmission lines and have spacings ds1, ds2 and spacings dh1, dh2, which can be referred as a "general isolation structure". The ground between the first signal line S1 and the second signal line S2 isolates a coupling interference between the two signal lines. However, part of energy still interferes with each other through the first signal line S1 and the second signal line S2. In this case, in order to increase the isolation of the general isolation structure, the spacing between the first signal line S1 and the second signal line S2 is necessary. However, more circuit board area is required to achieve high isolation. Therefore, the present disclosure further provides a floating area AF between the first area A1 and the second area A2 having similar structures, and is further described hereinafter.

Reference is made to FIGS. 1 and 2 again, in the floating area AF, a first ground extending portion GEP1 and a second ground extending portion GEP2 located in the second metal layer M2 are provided. The first ground extending portion GEP1 is electrically connected to the first ground line G1 (for example, through the via V1), and extends from a position corresponding to the first ground line G1 along a second direction D2 (that is, along a direction that the first ground line G1 towards the first signal line S1).

On the other hand, in the floating area AF, the second ground extending portion GEP2 is electrically connected to the second ground line G2 (for example, through the via V2), and extends from a position corresponding to the second ground line G2 along a third direction D3 (that is, along a direction that the second ground line G2 towards the second signal line S2).

The floating area AF further includes a second floating metal FL2, corresponding to the first floating metal FL1 formed in the second metal layer M2, and the second floating metal FL2 is electrically connected to the first floating metal FL2. For example, the second floating metal FL2 can be electrically connected to the first floating metal FL2 through a via VL located in the dielectric layer. In the above structure, the second floating metal FL2 is not electrically connected to the first ground line G1 and the second ground line G2.

It can be seen from FIGS. 1 and 2 that the ground between the first signal line S1 and the second signal line S2 is partially disconnected to form the floating metal disposed in the floating area AF, and ground paths in the first area A1 and the second area A2 are kept (that is, the third ground line G3 and the fourth ground line G4 are kept), which can form the isolation structure of the present disclosure.

Figure 4:
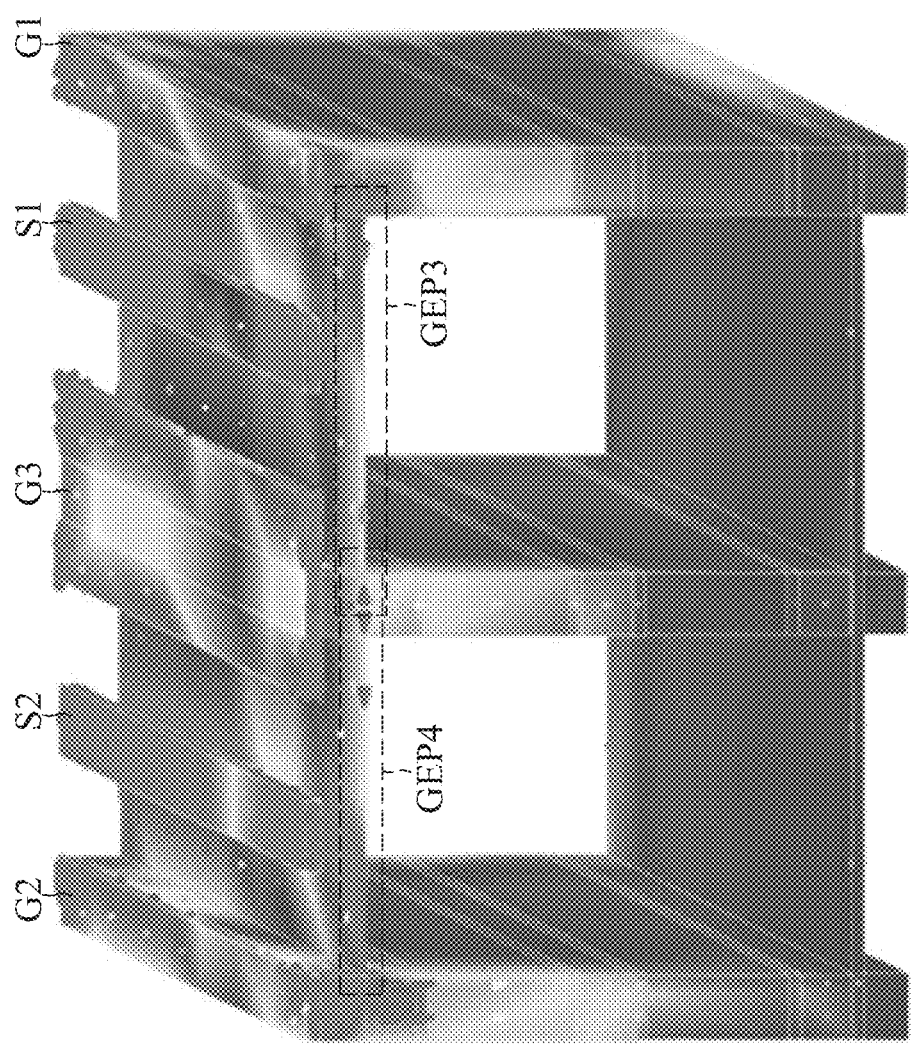
FIG. 4 is a current distribution diagram of a general isolation structure according to an embodiment of the present disclosure.

Reference is made to FIG. 4, which is a current distribution diagram of a general isolation structure according to an embodiment of the present disclosure. As shown in FIG. 4, it takes wirings on an actual PCB as an example. It is assumed that the PCB is provided with an 8-layer structure. The first signal line S1 and the second signal line S2 described above are located on the uppermost layer, and a second layer and a seventh layer are reference ground layers. The actual current distribution is shown in FIG. 4. The areas with relatively large currents are mostly concentrated on edges of the first ground line G1, the second ground line G2, the third ground line G3, the first signal line S1 and the second signal line S2, and arrows show directions of the currents. It can be seen from FIG. 4 that the closer to a signal terminal (the first signal line S1 or the second signal line S2), the greater the relative energy. Although the seventh layer is grounded, the current distribution thereof is relatively small. In addition, it can also be seen from FIG. 4 that the ground current of the second layer will flow to the left and right. Therefore, the PCB with only a general isolation structure has poor isolation.

Figure 5:
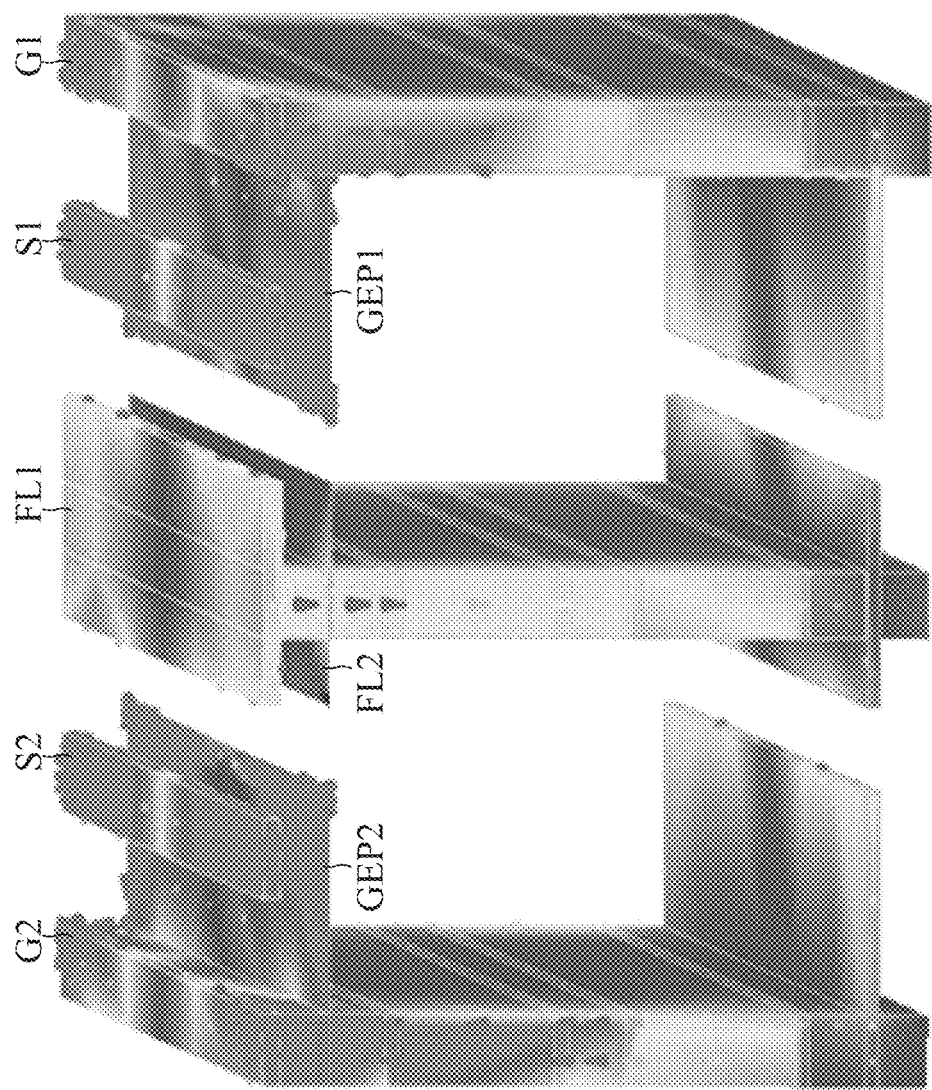
FIG. 5 is a current distribution diagram of the isolation structure of the floating region according to an embodiment of the present disclosure.

Reference is further made to FIG. 5, which is a current distribution diagram of the isolation structure of the floating region according to an embodiment of the present disclosure. The circuit board adopts an 8-layer structure similar to that in FIG. 4, so it is not repeated hereinafter. It can be seen from FIG. 5 that in an isolation structure of the floating area AF, the ground current of the second layer will not flow to the left and right in a local area, and thus an interference caused by the energy from the ground terminal can be reduced, thereby increasing the isolation between the first signal line S1 and the second signal lines S2.

As further shown in FIG. 1, for sizes, there are a spacing ds1 between the first signal line S1 and the first ground line G1, a spacing dh1 between the first signal line S1 and the first ground extending portion GEP1, a spacing ds2 between the second signal line S2 and the second ground line G2, and a spacing dh1 between the second signal line S2 and the second ground extending portion GEP2. The floating metal FL1 is separated from the first signal line S1 and the second signal line S2 by spacings Sf, respectively, such that the first signal line S1 and the second signal line S2 are impedance matched.

Figure 6:
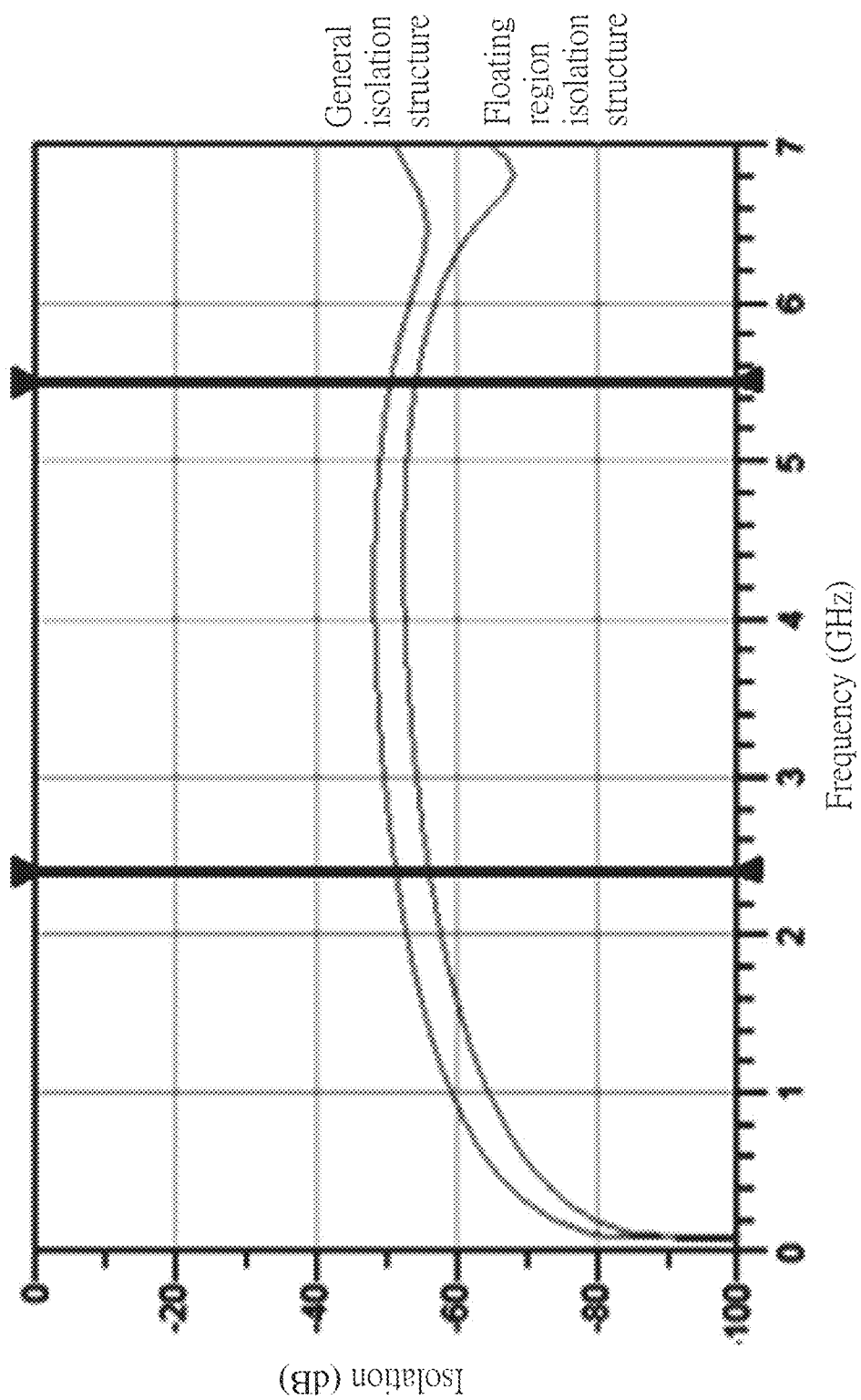
FIG. 6 is a graph showing isolation versus frequency of a general isolation structure and a floating region isolation structure according to an embodiment of the present disclosure.

The line length La as shown in FIG. 1 can preferably be greater than 200 mils. A line width w of the first signal line S1 and the second signal line S2 can be, for example, 7 mils. When the first signal line S1 and the second signal line S2 are impedance matched, the spacings ds1 and ds2 are 10 mils. If a line spacing Sp is 40 mils, the isolation between the first signal line S1 and the second signal line S2 can be shown in FIG. 6, FIG. 6 is a graph showing isolation versus frequency of a general isolation structure and a floating region isolation structure according to an embodiment of the present disclosure. As shown in FIG. 6, isolations of the general isolation structure are −51.2 dB at 2.4 GHz, and −51.2 dB at 5.5 GHz.

If the isolation structure of the floating area is utilized, the spacing Sf between the first floating metal FL1 and the first signal line S1, and the spacing Sf between the first floating metal FL1 and the first signal line S2, can be 3 mils, for example, which is the minimum line width used in a fabrication process. When a length Lf of the first floating metal FL1 is 200 mils, the isolation is as shown in FIG. 6. The isolations are −56.1 dB at 2.4 GHz and −54.2 dB at 5.5 GHz. It can be seen that the isolations of the isolation structure provided by the present disclosure is better than the general isolation structure in a range of 100 KHz-7 GHz.

Figure 7:
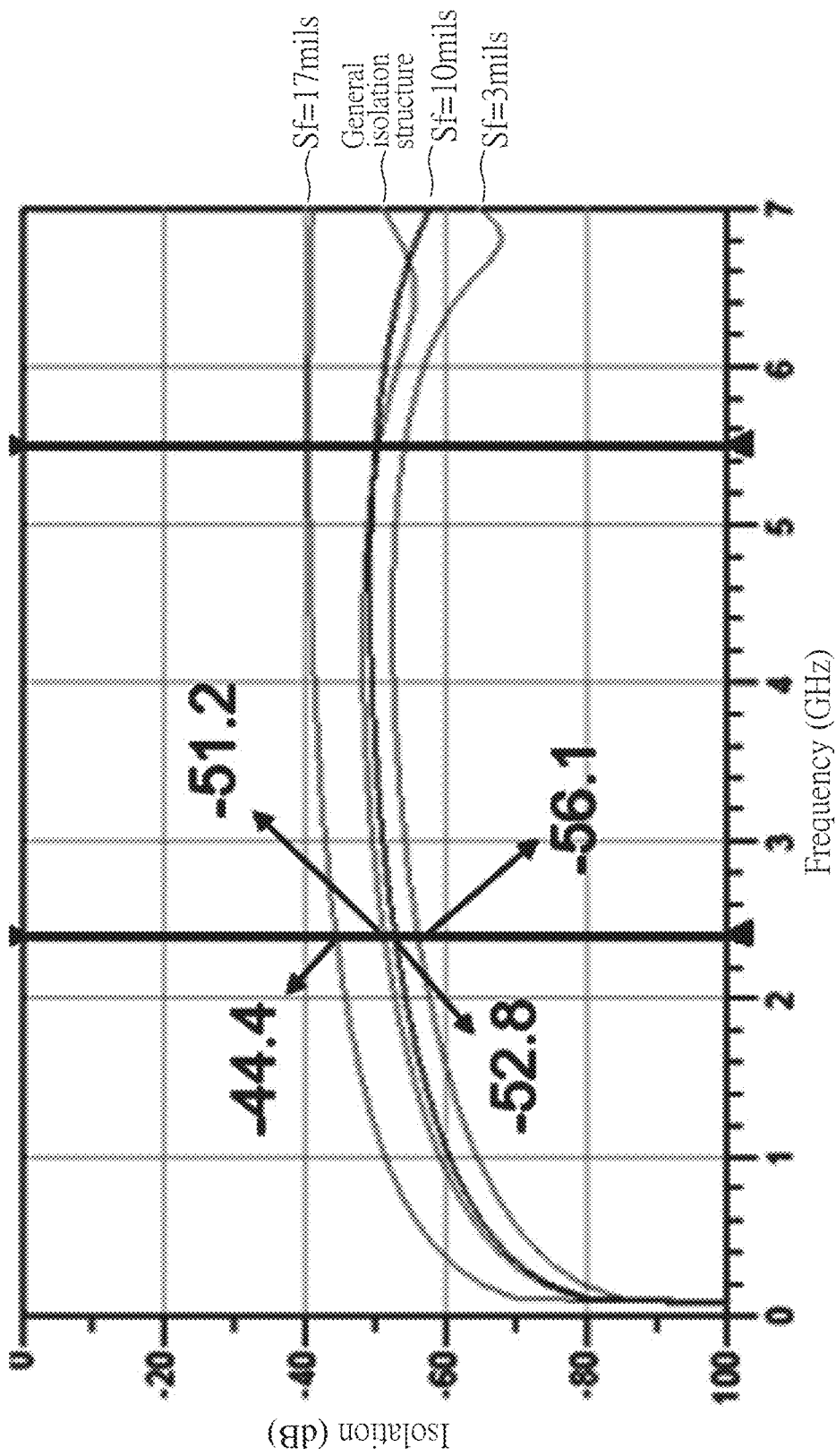
FIG. 7 is a graph showing isolations versus frequency of a general isolation structure and the isolation structure of the floating region at different spacings Sf according to the present disclosure.

On the other hand, in the isolation structure of the floating area AF, different isolation levels can be adjusted by adjusting the spacings Sf. As shown in FIG. 7, FIG. 7 is a graph showing isolations versus frequency of a general isolation structure and the isolation structure of the floating region at different spacings Sf according to the present disclosure. Taking the length Lf of 200 mil as an example, in 2.4 GHz frequency band, if the spacings Sf are 3 mil, the isolation is −56.1 dB, if the spacings Sf are 10 mil, the isolation is −52.8 dB, which is still better than the general isolation structure, but if the spacings Sf are 17 mils, since there is no equivalent capacitance formed directly under the signal lines, the isolation deteriorates to −44.4 dB.

Therefore, preferably, in the embodiment of the present disclosure, the spacings Sf can range from 3 mils to 10 mils. In response to the above limitations, the second floating metal FL2 is separated from the first ground extension GEP1 and the second ground extension GEP2 by spacings that ranged from 3 mils to 10 mils, and not less than the distance Sf.

In addition to the GCPW transmission line structure utilized in the foregoing embodiment, the embodiment of the present disclosure can further utilize a strip line architecture on the above basis. Reference is made to FIGS. 1 to 3, the structure of the strip line is provided by symmetrically forming all the components included in the second metal layer M2 (including the middle dielectric layer, vias and other structures) in another metal layer above the first metal layer M1, it is also divided into a first area A1, a floating area AF, and a second area A2.

Figure 8:
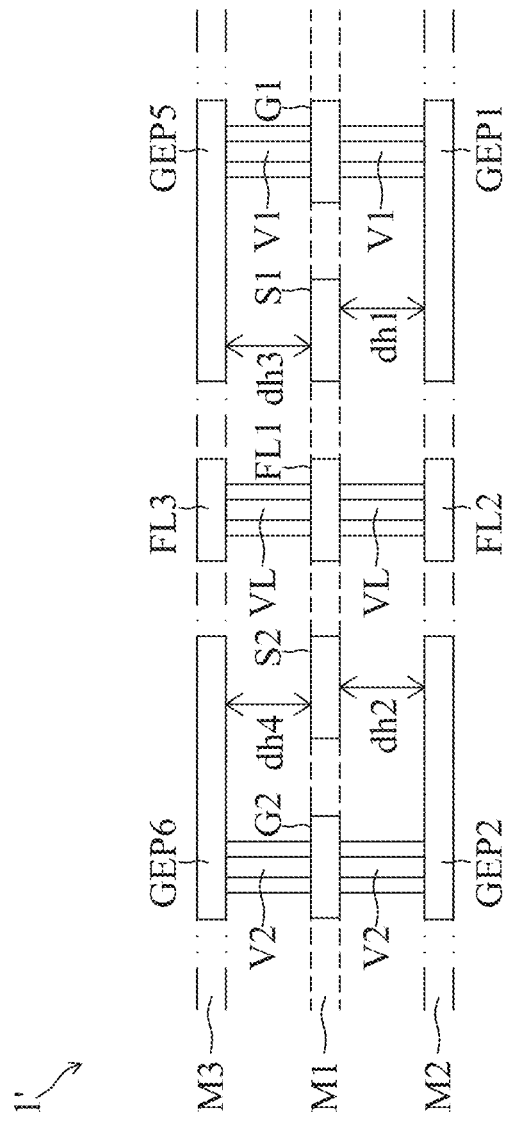
FIG. 8 is a cross-sectional view of a floating area of a circuit board structure using a microstrip line according to an embodiment of the present disclosure.
Figure 9:
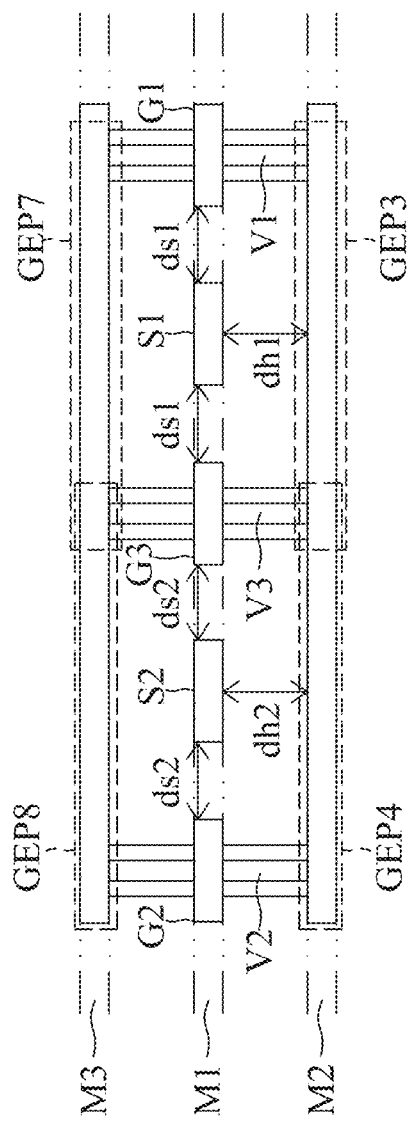
FIG. 9 is a cross-sectional view of a first region of the circuit board structure using microstrip lines according to the embodiment of the present disclosure.

Therefore, similarly, further reference may be made to FIGS. 8 and 9, which are respectively cross-sectional view of a floating area and a first area of a circuit board structure using a microstrip line according to an embodiment of the present disclosure.

As shown in FIG. 8, the first metal layer M1 is located between the second metal layer M2 and the third metal layer M3, and in the floating area AF, the circuit board structure 1' further includes a fifth ground extending portion GEP5, a sixth ground extending portion GEP6, and the third floating metal FL3. The fifth ground extending portion GEP5 is located in the third metal layer, electrically connected to the first ground line G1, and extended along the second direction D2 from a position corresponding to the first ground line G1.

On the other hand, the sixth ground extending portion GEP6 is also located in the third metal layer M3, is electrically connected to the second ground line G2, and extended from a position corresponding to the second ground line G2 along the third direction D3. The third floating metal FL3 is formed in the third metal layer M3 corresponding to the first floating metal FL1, and the third floating metal FL3 is electrically connected to the first floating metal FL2. For example, the third floating metal FL3 can be electrically connected to the first floating metal FL1 through the via VL in the dielectric layer. In the above structure, the third floating metal FL3 is not electrically connected to the first ground line G1 and the second ground line G2. It should be noted that a spacing between the first signal line S1 and the fifth ground extending portion GEP5 can be the same as the spacing dh1, and a spacing dh4 between the second signal line S2 and the sixth ground extending portion GEP6 can be the same as the spacing dh2 to form a symmetrical structure, while the first signal line S1 and the second signal line S2 being impedance matched.

Furthermore, as shown in FIG. 9, in the first area A1, the first ground line G1 is electrically connected to the third ground line G3 through a seventh ground extending portion GEP7 located in the third metal layer M3, and the second ground line G2 is electrically connected to the third ground line G3 through an eighth ground extending GEP8 in the third metal layer M3. On the other hand, there is a similar structure in the second area A2. The first ground line G1 is electrically connected to the fourth ground line G4 through the seventh ground extending portion GEP7 in the third metal layer M3, and the second ground line G2 is electrically connected to the fourth ground line G4 through the eighth ground extending portion GEP8 in the third metal layer M3.

Therefore, similarly, the circuit board structure 1' is similar to that of FIG. 5. In the isolation structure of the floating area AF, ground currents in the first metal layer M1 and the third metal layer M3 will not flow to the left and right (the second directions D2 and the third direction D3) in a local area, and thus interferences caused by energy from the ground terminal can be reduced, thereby increasing the isolation between the first signal line S1 and the second signal line S2.

In conclusion, the circuit board structure for improving isolation provided by the present disclosure can add a section of floating metal between two signal transmission lines, and appropriately adjust distances between the floating metal and the two signal transmission lines, so as to prevent ground current from flowing in a local area, reduce interferences caused by energy from ground, and improve the isolation on the printed circuit board without any additional components.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A circuit board structure for improving isolation, comprising:
   a first signal line disposed along a first direction and across a first area, a floating area and a second area arranged in sequence;
   a first ground line disposed at a first side of the first signal line;
   a second signal line disposed at a second side of the first signal line, wherein the first side is opposite to the second side;
   a first floating metal disposed between the first signal line and the second signal line, parallel to the first signal line and the second signal line, and floatingly disposed in the floating area;
   a second ground line disposed at the second side, wherein the second signal line is located between the second ground line and the first signal line;
   a third ground line disposed between the first signal line and the second signal line, and disposed in the first area;
   a fourth ground line disposed between the first signal line and the second signal line, and disposed in the second area, wherein the first signal line, the second signal line, the first floating metal, the first ground line, the second ground line, the third ground line, and the fourth ground line are located in a first metal layer;
   a first ground extending portion located in the floating area and a second metal layer, electrically connected to the first ground line, and extending from a position corresponding to the first ground line, along a second direction that the first signal line towards the first ground line, wherein the second metal layer is different from the first metal layer; and a second ground extending portion located in the floating area and the second metal layer, electrically connected to the second ground line, and extending from a position corresponding to the second ground line, along a third direction that the second ground line towards the second signal line;

wherein the first floating metal is floatingly disposed in the floating area, and is not electrical connected to the first ground line, the second ground line, the third ground line and the fourth ground line.

2. The circuit board structure according to claim 1, wherein the first ground line is electrically connected to the third ground line and the fourth ground line respectively in the first area and the second area through a third ground extending portion located in the second metal layer, and the second ground line is electrically connected to the third ground line and the fourth ground line respectively in the first area and the second area through a fourth ground extending portion located in the second metal layer.

3. The circuit board structure according to claim 2, wherein the first signal line is separated from the first ground line by a first spacing, the first signal line is separated from the first ground extending portion by a second spacing, the second signal line is separated from the second ground line by a third spacing, the second signal line is separated from the second ground extending portion by a fourth spacing, and the first floating metal is separated from the first signal line and the second signal line by a fifth spacing, such that the first signal line and the second signal line are impedance matched.

4. The circuit board structure according to claim 3, wherein the fifth spacing ranges from 3 mils to 10 mils.

5. The circuit board structure according to claim 4, further comprising a second floating metal formed in the floating area and the second metal layer and corresponding to the first floating metal, and electrically connected to the first floating metal, wherein the second floating metal is not electrically connected to the first ground line and the second ground line.

6. The circuit board structure according to claim 5, wherein the second floating metal is separated from the first ground extending portion and the second ground extending portion by a spacing ranging from 3 mils to 10 mils and being not less than the fifth spacing.

7. The circuit board structure according to claim 1, wherein the first signal line and the second signal line are each a differential signal line.

8. The circuit board structure according to claim 7, wherein the first ground line is electrically connected to the third ground line and the fourth ground line respectively in the first area and the second area through a seventh ground extending portion located in the third metal layer, and the second ground line is electrically connected to the third ground line and the fourth ground line respectively in the first area and the second area through an eighth ground extending portion located in the third metal layer.

9. The circuit board structure according to claim 1, further comprising:

a fifth ground extending portion located in the floating area and in a third metal layer, electrically connected to the first ground line, and extending along the second direction from a position corresponding to the first ground line, wherein the first metal layer is located between the second metal layer and the third metal layer;

a sixth ground extending portion located in the floating area and in the third metal layer, electrically connected to the second ground line, and extending along the third direction from a position corresponding to the second ground line; and a third floating metal formed in the floating area and the third metal layer and corresponding to the first floating metal, and electrically connected to the first floating metal, wherein the third floating metal is not electrically connected to the first ground line and the second ground line.

10. The circuit board structure according to claim 9, wherein the first signal line is separated from the first ground line by a first spacing, the first signal line is separated from the first ground extending portion by a second spacing, the second signal line is separated from the second ground line by a third spacing, the second signal line is separated from the second ground extending portion by a fourth spacing, and the first floating metal is separated from the first signal line and the second signal line by a fifth spacing, respectively, the first signal line is separated from the fifth ground extending portion by a sixth spacing, and the second signal line is separated from the sixth ground extending portion by a seventh spacing, such that the first signal line and the second signal line are impedance matched.

* * * * *